United States Patent [19]

Brower

[11] 4,210,465
[45] Jul. 1, 1980

[54] CISFET PROCESSING INCLUDING SIMULTANEOUS IMPLANTATION OF SPACED POLYCRYSTALLINE SILICON REGIONS AND NON-MEMORY FET CHANNEL

[75] Inventor: Ronald W. Brower, Dayton, Ohio
[73] Assignee: NCR Corporation, Dayton, Ohio
[21] Appl. No.: 962,422
[22] Filed: Nov. 20, 1978
[51] Int. Cl.$^2$ .................. H01L 7/34; H01L 11/00; B01J 17/00
[52] U.S. Cl. ................. 148/1.5; 148/187; 357/23; 357/40; 357/59; 357/91
[58] Field of Search ............ 148/1.5, 187; 357/23, 357/41, 91, 59, 40; 29/571

[56] References Cited

U.S. PATENT DOCUMENTS

| | | | |
|---|---|---|---|
| 3,841,926 | 10/1974 | Garnache et al. | 148/188 |
| 3,889,358 | 6/1971 | Bierhenke | 29/571 |
| 3,891,190 | 6/1975 | Vadasz | 357/41 |
| 3,996,657 | 12/1976 | Simko | 29/571 |
| 4,011,105 | 3/1977 | Paivinen et al. | 148/1.5 |
| 4,019,197 | 4/1977 | Lohstroh et al. | 357/23 |
| 4,075,045 | 2/1978 | Rideout | 148/175 |
| 4,080,718 | 3/1978 | Richman | 29/571 |
| 4,080,719 | 3/1978 | Wilting | 29/571 |
| 4,099,317 | 7/1978 | Su | 29/571 |
| 4,102,733 | 7/1978 | De La Moneda et al. | 156/633 |

*Primary Examiner*—L. Dewayne Rutledge
*Assistant Examiner*—Upendra Roy
*Attorney, Agent, or Firm*—J. T. Cavender; Philip A. Dalton

[57] ABSTRACT

A process for forming a CIS (conductor-insulator-semiconductor) integrated circuit having one or more non-memory field-effect transistors, and one or more polysilicon resistors and/or polysilicon conductors. A single mask and implant sequence is used to establish the threshold voltage of the field-effect transistor and the resistance (conductance) of the polysilicon components. The polysilicon components are formed to predetermined sizes, as needed, so that the threshold-determining implant provides the desired polysilicon resistance value(s).

6 Claims, 12 Drawing Figures

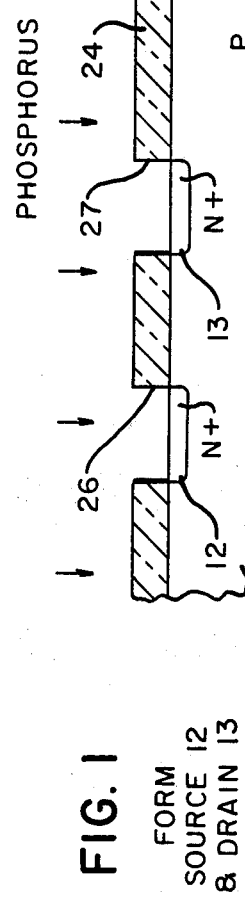
FIG. 1 FORM SOURCE 12 & DRAIN 13
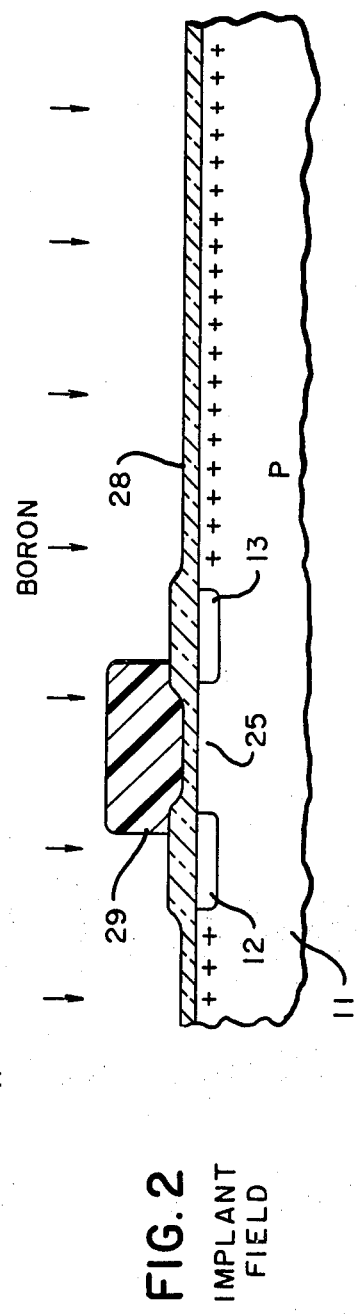
FIG. 2 IMPLANT FIELD
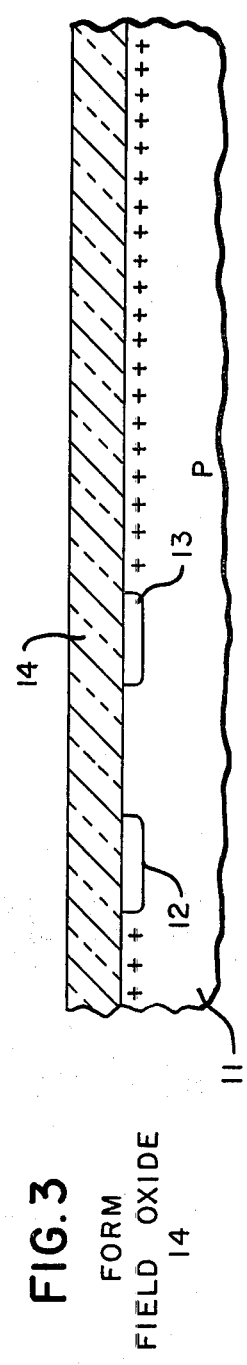
FIG. 3 FORM FIELD OXIDE 14

FORM POLYSILICON & OXIDE

FORM MASK 32

PATTERN POLYSILICON

REMOVE MASK 32

MASK & ETCH

IMPLANT

FORM GATE OXIDE

FORM NITRIDE & CUTS

METALLIZATION

CISFET PROCESSING INCLUDING SIMULTANEOUS IMPLANTATION OF SPACED POLYCRYSTALLINE SILICON REGIONS AND NON-MEMORY FET CHANNEL

CROSS-REFERENCE TO RELATED APPLICATIONS

This application is related to U.S. Ser. No. 962,432, which discloses a process for forming both memory and non-memory CISFETS and which uses a simultaneous memory channel-polysilicon implant.

BACKGROUND OF THE INVENTION

The invention relates to CIS technology, and, more particularly, to processes for forming CIS integrated circuits which utilize non-memory field effect transistors (FETs) and passive polysilicon components.

The cost and time required to fabricate CIS microelectronic circuits is related directly to the number of masking steps. Unfortunately, when polysilicon resistors or conductors are used in such circuits, separate masking (and doping) sequences are used to establish the threshold voltage of the field-effect transistors and the resistance of the polysilicon. It is desirable to reduce the number of such steps, for example, by combining the separate masking steps.

The prior art teaches doping one or more active and/or passive circuit components using a single doping step. For example, U.S. Pat. No. 4,075,045 issued Feb. 21, 1978, to Rideout, uses the source and drain diffusion process to simultaneously form a substrate capacitor electrode. U.S. Pat. No. 3,889,358, issued June 17, 1975, to Bierhenke, tailors the threshold voltage of an FET and the resistance of a substrate load resistor of an inverter circuit by simultaneous doping. The resistance of the resistor can very widely, without any serious effect on the performance of the circuit. Thus, the impurity concentration resulting from the doping is unimportant.

U.S. Pat. No. 3,996,657 issued Dec. 14, 1976 to Simko relates to a floating gate, avalanche injected, MOS (metal oxide semiconductor) structure and to a process for doping the source and drain simultaneously with the doping of the polysilicon floating gate or the polysilicon control gate. Simultaneous doping apparently is possible because the doping level for the gate can vary widely, or because the gate has the same doping level requirements as the source and drain.

In U.S. Pat. No. 4,080,718 issued Mar. 28, 1978 to Richman, an FET channel is doped by implantation through a polysilicon gate, which is doped incidentally to the channel doping. In U.S. Pat. No. 3,750,268, issued Sept. 10, 1971 to Wang, source and drain electrodes are apparently doped incidentally to the process of establishing ohmic contact between the source and drain and their respective electrodes.

It is apparent that simultaneous doping of field-effect transistors and polysilicon conductors or resistors to establish the threshold voltage and to establish the conductance or resistance of the polysilicon is highly desirable to the aim of reducing masking steps and, therefore, production costs. It is also apparent that the above patents have achieved advances in the use of implantation and diffusion during MOSFET processing. These patents indicate that various substrate components can be doped simultaneously, and that, where the precise resistance of polysilicon is unimportant, polysilicon components can be doped as a by-product of forming other components. However, these patents provide no suggestion as to how simultaneous doping of active devices and polysilicon components might be achieved when the resistance of the polysilicon must be controlled relatively precisely.

SUMMARY OF THE INVENTION

The present invention relates to a process for forming CISFET integrated circuits which utilize non-memory FETs and polysilicon passive components. The process provides simultaneous doping of the non-memory FETs and the polysilicon components. After partially forming the integrated circuit by forming a channel-defining source and drain in a semiconductor substrate and forming a field oxide layer over the substrate, and prior to forming the gate electrode, one or more polysilicon components is formed on the field oxide with the size of the components being selected to provide a predetermined resistance for a given impurity concentration. Then, a single mask is formed and used as an etching mask during formation of the gate (channel) windows and source and drain contact windows in the field oxide, and as a doping mask during implantation of the gate and polysilicon. The implantation provides the given impurity concentration in the FET channel and in the polysilicon to adjust the threshold voltage of the memory section and the resistance of the polysilicon components, respectively. A non-memory gate insulator is formed on the substrate within the channel aperture and additional gate insulator layers are provided, as required, prior to forming the gate electrode.

BRIEF DESCRIPTION OF THE DRAWINGS

FIGS. 1–12 are cross-sectional representations of the sequential stages of fabricating an MNOS circuit using the process of the present invention.

DETAILED DESCRIPTION

Figure 12:
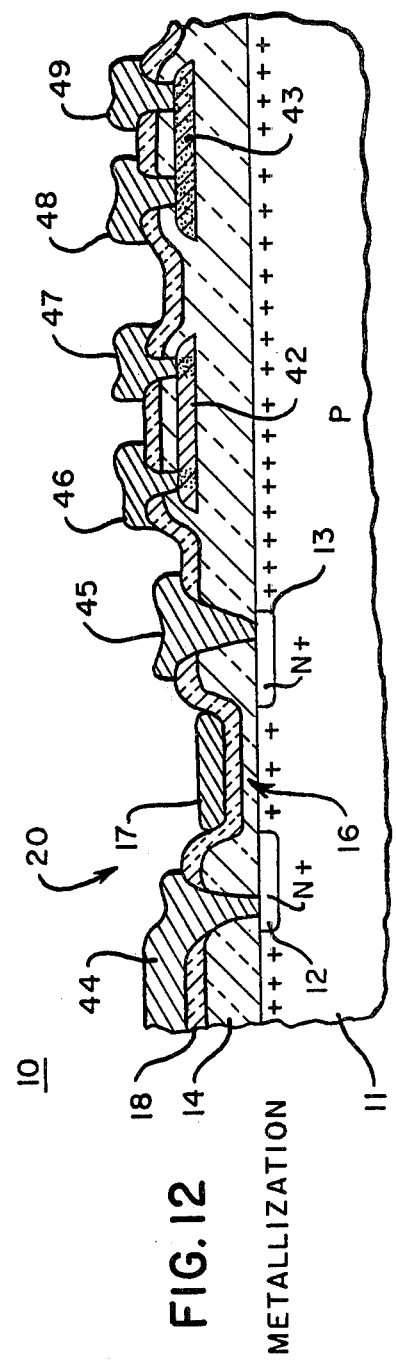

FIG. 12 is a partial cross-sectional view of a CIS integrated circuit 10 formed according to the present invention. The view is perpendicular to the channel of non-memory CISFET 20. As used here, the term CIS is generic to such structure types as SOS (silicon oxide semiconductor) MOS (metal oxide semiconductor), SNOS (silicon nitride oxide semiconductor) and MNOS (metal nitride oxide semiconductor). The exemplary integrated circuit 10 is N-channel MNOS. The invention is applicable to P-channel also.

The circuit 10 comprises a semiconductor substrate 11 of one conductivity type (illustratively, P-type) within which spaced-apart surface-adjacent regions of the opposite conductivity type (N-type) form source 12 and drain 13 of MNOSFET 20. A thick insulating layer 14, typically of silicon dioxide, is formed on the substrate 11 for electrically isolating the components of the circuit 10. The FET 20 includes a gate structure comprising gate dielectric 16 and gate electrode 17 which overlie the channel region between the source 12 and the drain 13.

Gate dielectric 16 imparts non-memory characteristics to the CISFET 20. As a general rule and as used here, good memory characteristics and the term gate "memory dielectric" or gate "memory insulator" imply a high concentration of charge trapping centers and relative ease of charge transfer between the charge-storing dielectric and, e.g., the substrate. As used here, "non-memory dielectric" or "non-memory insulator"

includes a single layer (or multiple layers) which has a low concentration of charge trapping centers and/or poor charge transfer characterstics and also multiple layers, such as the oxide and nitride layers of MNOS, in which an intervening non-memory material (oxide) is sufficiently thick to prevent, or otherwise prevents charge transfer between the memory dielectric (nitride) and the substrate.

The integrated circuit 10 may include polysilicon components such as conductor 43 for interconnecting various circuit elements, and polysilicon resistors such as 42. (Although "conductor" and "resistor" are used separately herein, it is to be understood that "components" includes both low resistance components, i.e., conductors, and relatively high resistance components, i.e., resistors. Also, the plural "components" includes the singular "component", and vice versa.) Metal electrodes 44 and 45, 46 and 47, and 48 and 49 provide electrical connection to the source 12 and drain 13, the contact regions of the polysilicon resistor 42, and the contact regions of the polysilicon conductor 43, respectively.

Those skilled in the art will understand that the FIG. 12 structural arrangement is chosen merely to facilitate description: for example, contact usually is made to a single point along each of a pair of diffusion stripes which comprise the source and drain and at various points along a network of conductors and resistors. Also, a passivation layer or layers (not shown) can be formed over the circuit 10.

The present invention relates to a process for forming integrated circuits such as CIS circuit 10 and, more particularly, to a process which uses a single mask for etching the gate window and for establishing the threshold of non-memory FETs such as 20, and the resistance (conductance) of polysilicon conductors such as 43, polysilicon resistors such as 42 and the contact regions thereof.

Table I summarizes the steps of an exemplary process which utilizes the single mask deposition sequence, and relates the steps to the corresponding figures of the drawing.

TABLE I

| Step | Figure | Description |
|------|--------|-------------|
| 1 | 1 | Source and drain formation. |
| 1.1 | | Grow or deposit implant-or diffusion-masking oxide layer. |
| 1.2 | | Delineate photoresist mask. |
| 1.3 | | Form oxide mask 24. |
| 1.4 | | Remove photoresist mask. |
| 1.5 | | Deposit or implant source 12 and drain 13. |
| 1.6 | | Remove oxide mask 24. |
| 2 | 2 | Field implant. |
| 2.1 | | Grow or deposit implant-masking oxide layer 28. |
| 2.2 | 2 | Delineate channel photoresist mask 29. |
| 2.3 | | Implant field. |
| 2.4 | | Remove photoresist mask 29. |
| 2.5 | | Remove oxide layer 28. |
| 3 | 3 | Form field oxide layer 14. |
| 4 | 7 | Polysilicon component formation. |
| 4.1 | 4 | Form polysilicon layer 31. |
| 4.2 | | Deposit or grow oxide layer 32. |
| 4.3 | | Delineate photoresist mask 33. |
| 4.4 | 5 | Pattern oxide mask 32. |
| 4.5 | 6 | Remove photoresist mask 33. |
| 4.6 | | Pattern polysilicon conductors/resistors. |
| 4.7 | 7 | Remove oxide mask 32. |
| 5 | 8,9 | Contact cuts and implant. |

TABLE I-continued

| Step | Figure | Description |
|------|--------|-------------|
| 5.1 | 8 | Delineate mask 51 for contact cuts, gate cut, and polysilicon implant. |
| 5.2 | | Etch source contact cut, gate cut, drain contact cut 36, 37, 38 in field oxide 14. |
| 5.3 | 9 | Channel and polysilicon implant. |
| 5.4 | | Remove photoresist. |
| 6 | 10 | Form gate (non-memory) oxide 16. |
| 7(opt.) | 11 | Form silicon nitride 18. |
| 8 | 11 | Develop contact cuts 74, 75, 76, 77, 78, 79. |
| 8.1 | | Delineate photoresist mask. |
| 8.2 | | Etch FET and polysilicon contact cuts in nitride (optional), then oxide. |
| 9 | 12 | Metallization. |
| 9.1 | | Deposit metal. |
| 9.2 | | Delineate photoresist mask. |
| 9.3 | | Pattern metal. |

As indicated in the Table, initially the source 12 and drain 13 are formed in the substrate 11 (step 1, FIG. 1). First, the implant or diffusion masking oxide layer 24 is grown to a typical thickness of 1,000–1,500 Angstroms (0.1–0.15 microns; step 1.1). The thickness is selected to prevent drive-in of impurities into the masked areas of the substrate during the subsequent source and drain formation. One suitable techinque is to steam-grow the oxide. Other techniques include growth in dry oxygen, pyrolitic decomposition, and plasma deposition. A photoresist mask (not shown) is than applied to the oxide layer 24 (step 1.2) for use in delineating source and drain windows in the oxide layer. Using conventional photolithographic techinques and positive or negative photoresist, the photoresist typically is sprayed or spun onto the oxide, dried, masked to alter the solubility in developer of exposed areas, exposed to ultraviolet light, then developed. For positive photoresist, the exposed areas correspond to the source and drain windows, exposure increases the solubility of the exposed areas, and subsequent developing removes the exposed areas. For negative photoresist, the masked areas correspond to the source and drain windows, exposure decreases the solubility of the exposed areas, the subsequent developing removes the masked areas.

Source and drain windows 26 and 27 (also termed "cuts" or "apertures") are then formed in the oxide masking layer 24 by etching via the photoresist mask using any of numerous conventional techniques such as liquid bath etching (step 1.3). One suitable etchant is a buffered hydrofluoric acid mixture of hydrofluoric acid and ammonium fluoride.

The photoresist then may be stripped from the oxide masking layer 24 (step 1.4) and the substrate may be doped via the oxide windows using implantation or diffusion of N-type impurities such as phosphorus (step 1.5). Diffusion is preferred. In a typical diffusion process, oxygen is bubbled through $POCl_3$ at, e.g., 900° C. to form a phosphorus-doped oxide layer, then the phosphorus is diffused or driven-in to the desired junction depth, $x_j$, using a drive-in temperature of, e.g., 925° C. A typical diffusion process results in a junction depth of about one micron and a concentration of about 10· atoms of phosphorus per cubic centimeter. The deposition provides heavily doped N+ regions which will serve as the source 12 and drain 13 of FET 20.

The oxide masking layer 24 is now removed (step 1.6) using a conventional etchant such as buffered hydrofluoric acid.

A field area implant (step 2, FIG. 2) is initiated by growing or depositing a layer 28 of silicon dioxide on the substrate 11 (step 2.1). The oxide layer 28 is about 450 A° thick here and serves as a "semi-barrier" to control the amount of, and penetration depth of, the field implant reaching the silicon substrate. A thicker or thinner oxide layer 28 will serve, as long as the field implant energy is increased or decreased accordingly. As in the previous oxide formation, the layer 28 may be grown by any of the conventional techniques.

Next, channel-protecting photoresist mask 29 is formed by conventional photolithographic techniques (step 2.2), then the field regions of the device are heavily implanted (step 2.3) to make these regions more strongly P-type and to thereby eliminate field parasitic device action. This may be done by implantation of boron ions using an energy of 30 keV and a dose of $3 \times 10^{12}/cm^2$. As shown in FIG. 2, the photoresist mask 29 prevents implantation of the FET channel 25 during the field implant step. After the implant is completed, the photoresist mask 29 is stripped (step 2.4) and oxide layer 28 is removed using an etchant such as buffered hydrofluoric acid (step 2.5).

In step 3, (FIG. 3), the thick field oxide layer 14 is formed using conventional techniques such as pyrolytic decomposition.

Next, the polysilicon components are formed (step 4). This step is crucial, for the dimensions of the polysilicon components are tailored to provide the desired polysilicon resistance after the FET threshold implant in step 5. That is, the length l, and the cross-sectional area, A, of the various polysilicon regions are formed to predetermined dimensions to provide a predetermined resistance, R, where $R = \rho l/A$. Here, $\rho$ is the resistivity of the polysilicon and is determined by the concentration of implanted impurities resulting from the FET threshold implant in step 5. In short, the dimensions of the polysilicon are established, as required, in step 4 so that the threshold voltage-determining implant of step 5 can also be used to simultaneously implant the polysilicon and thereby provide the desired resistance in polysilicon regions such as the body of resistor 42 and/or conductor 43.

It should be noted that the resistor contact resistance and conductor contact resistance are not determined by $R = \rho(l/A)$, but rather by the type of alloying action that occurs between the metal and the polysilicon. Some of the metal electrode atoms must migrate into the polysilicon and vice-versa in order to form a low-resistance contact. In addition, the formation of a p-n junction must be avoided. If, for example, aluminum is used for the metal electrode, it will act as a p-type dopant when it migrates into the polysilicon. In order to prevent the formation of a p-n junction in the silicon, the polysilicon in the contact region must have been previously doped either (1) p-type or (2) heavily-enough n-type so that the p-type doping due to the presence of aluminum in polysilicon is entirely cancelled.

The polysilicon components are formed by depositing a layer of polysilicon 31 to the desired thickness, t, to provide the predetermined cross-sectional area A (step 4.1, FIG. 4) using a conventional technique such as pyrolysis of silane ($SiH_4$). A silicon oxide layer 32 is then grown on the polysilicon 31 (step 4.2, FIG. 4) using one of the techniques discussed relative to steps 1.1. Then, standard photolithographic techniques are used to delineate the photoresist mask 33 (step 4.3, FIG. 4). The oxide mask 32 is next patterned via the photoresist mask 33 using, e.g., hot phosphoric acid etchant (step 4.4, FIG. 5). The photoresist mask 33 is now removed (step 4.5) and a selective etchant, such as a mixture of hydrochloric, nitric, and acetic acids, is applied to the polysilicon layer 31 via the oxide mask 32 to form the polysilicon, including the resistor 42 and conductor 43 (step 4.6, FIG. 6). This polysilicon formation step establishes the width, w, of the various polysilicon regions and, thus, establishes the predetermined cross-sectional areas according to A=tw. Finally, the oxide mask 32 is removed (step 4.7, FIG. 7), as by etching in the aforementioned hydrochloric-nitric-acetic acid mixture.

In step 5, a single mask 51 is formed and is used both for etching gate and contact windows in the field oxide and also for implanting the FET gate (channel) and the polysilicon components.

Figure 8:
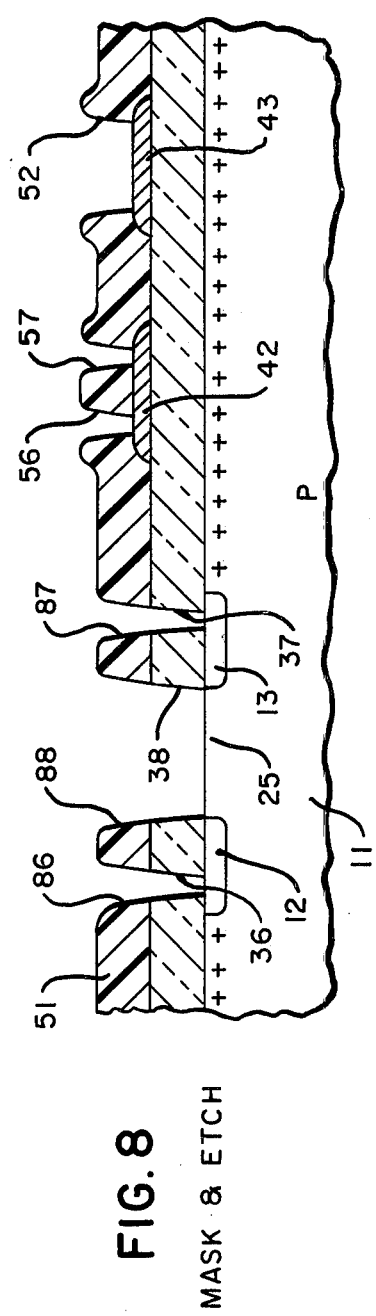

First, in step 5.1, standard photolithographic techniques are used to form the photoresist mask 51. See FIG. 8. This mask has apertures or windows 86, 87, and 88 which define source and drain contact cuts 36 and 37 and the gate or channel cut 38 in the field oxide; and has deposition windows 52, 56, and 57 for doping the conductor body (52) and the resistor contacts (56 and 57).

The source contact cut, gate cut, and drain contact cut 36, 37, and 38, respectively, are formed by etching the field oxide 14 via the mask 51 (step 5.2). This step defines the areas for the channel implant and the gate dielectric and decreases the amount of etching required in the source and drain contact areas during the later contact etch.

Figure 9:
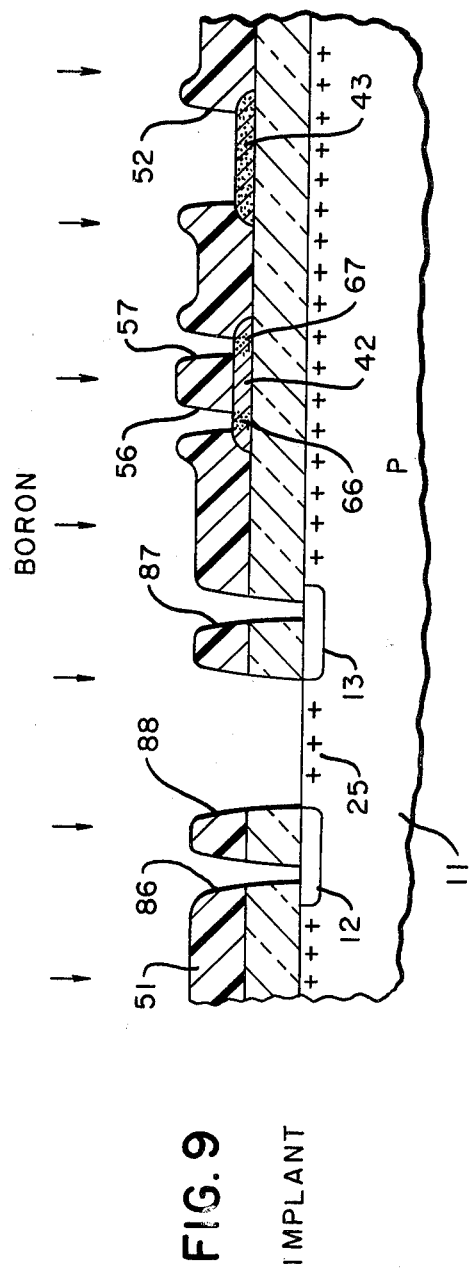

The gate and polysilicon components are now implanted using the mask 51 to define the implanted regions (step 5.3, FIG. 9). The mask windows 88, 52, and 56 and 57 correspond, respectively, to the FET channel region 25, the conductor body 43, and the contact regions 66 and 67 of the polysilicon resistor 42. P-type ions such as boron are implanted via the mask 51 to the required concentration to establish the desired threshold voltage of the FET channel 25. As described relative to step 4, the length l and cross-sectional area A of the polysilicon body of conductor 43 were tailored so that this threshold voltage-determining implant concentration also gives the desired resistance value(s). A typical boron implantation utilizes 30 keV energy and a dose of $5 \times 10^{12}/cm^2$. (The resistor body may also be implanted and the l and A of the resistor may be tailored to give the desired resistance value(s) after the implant, but for purposes of illustration, FIG. 9 shows a resistor body that provides the desired resistance without being implanted.) The source and drain contact areas are doped with p-type dopant incidentally to this step, but the concentration is insignificant relative to te existing concentration of n-type dopant. Photoresist mask 40 is now removed (step 5.4).

Figure 10:
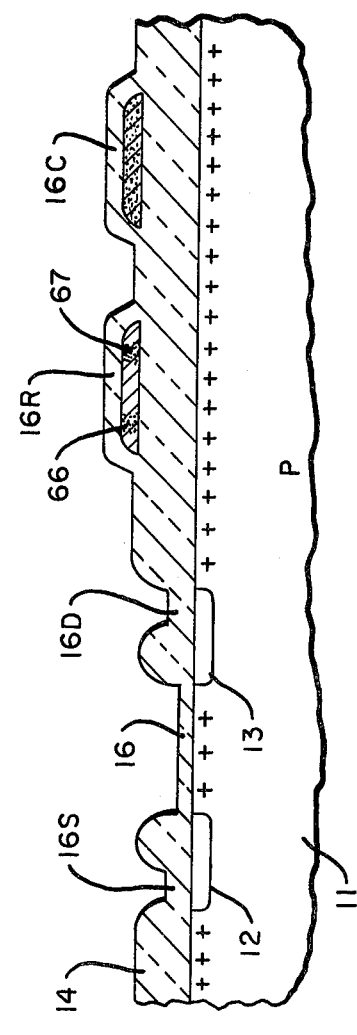

In step 6 (FIG. 10), non-memory gate oxide 16 is formed on the substrate 11 within the field oxide gate window 38. Typically, the gate oxide is formed about 400 to 500 Angstroms (0.04 to 0.05 microns) thick, using one of the conventional growth and deposition processes mentioned pursuant to step 1.1. Because it is usually desirable that the gate oxide be dense and of high quality, a process such as dry thermal oxidation is preferred. As shown in FIG. 10, the gate oxide growth process simultaneously and incidentally forms oxide layers 16C and 16R over the polysilicon conductor and resistor components, and oxide 16S and 16D within the oxide windows 36 and 37 over the source and drain.

In step 7 (FIG. 11), silicon nitride layer 18 may be formed over the top surface of the partially completed wafer. One suitable process is chemical vapor deposition using silane and ammonia reactants. The silicon nitride layer 18 is optional, is usually not required for non-memory FETs, but is useful for enhancing the integrity of silicon dioxide.

Figure 11:
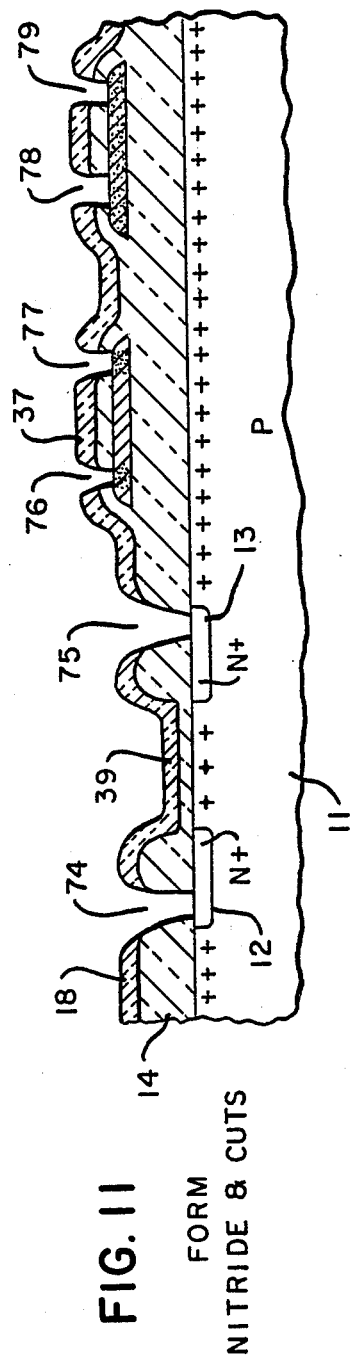

Next, contact cuts are etched (step 8, FIG. 11). First, a photoresist mask (not shown) is formed over the silicon nitride 18, or over the oxide layer of FIG. 10 if the nitride is omitted (step 8.1). Then, contact windows 74 and 75 for the source and drain of FET 20 and contact windows 76–79 for the polysilicon components are etched in the nitride (if present) using hot phosphoric acid, then in the silicon oxide using an etchant such as buffered hydrofluoric acid (step 8.2).

Metal conductors 44, 45, 46, 47, 48 and 49 are then connected through the contact windows to the source and drain of FET 20 and to the polysilicon components (step 9, FIG. 12). First, a layer of (1) polysilicon or (2) of metal such as aluminum or aluminum-silicon alloy is formed on the nitride to a thickness of 10,000 to 15,000 Angstroms (1 to 1.5 microns) using a conventional technique such as (1) chemical vapor deposition using pyrolysis of silane or (2) vacuum evaporation (step 9.1). A photoresist mask (not shown) is formed to delineate the desired conductor pattern (step 9.2). The conductor contacts and interconnects such as 44, 45, 46, 47, 48 and 49 are then formed by etching the conductor layer via the photoresist mask (step 9.3). Finally, a passivation layer (or layers) may be formed over the circuit.

It will be appreciated that an anneal for subsequent high temperature process steps may be used, as desired, to repair any structural damage caused by ion implantation and to activate the implanted species.

The above discussion refers to doping the resistor contacts and the conductor body. Those skilled in the art will readily appreciate that both the resistor body and the conductor body can be doped, as mentioned previously. That is, the resistor(s) as well as the conductor(s) can be formed to size taking into account the memory doping level, and the memory threshold doping is then used to implant the resistor body and the conductor body and thereby to simultaneously establish the resistance of the conductor and the resistor. Of course, various combinations of implanted and unimplanted polysilicon components, and contact implants and body implants are readily implemented.

EXAMPLE

The process can be used to form on the same chip a non-memory FET 20 having a threshold of 1.2 volts, and a polysilicon resistor 42 having a resistance of about 10 megohms and contact resistance of less than one megohm. The substrate is a p-type silicon wafer of 5 to 9 ohm-cm resistivity. After the appropriate masking steps, as described above, the source 12 and drain 13 are formed as shown in FIG. 1, by diffusion, by bubbling oxygen through POCl$_3$ at about 900° C. to form phosphorus-doped oxide "predeposition" layers over the source and drain regions, then driving in the phosphorus by applying a temperature of about 925° C. for about 30 minutes. This provides a source and drain of about $10^{19}/cm^3$ concentration and a junction depth of about one micron. Oxide mask 24 is now stripped.

Next, referring to FIG. 2, oxide masking layer 28 is grown to a thickness of 450° A and the channel is covered with a protective layer of photoresist 29. The field regions of the circuit 10 are implanted with boron using 30 keV and a dose of about $3 \times 10^{12}/cm^2$. Then, photoresist 29 is stripped.

After removing the oxide layer 28, the field oxide 14 is formed 10,000 Angstroms thick (about one micron) using chemical vapor deposition. See FIG. 3.

Figure 4:
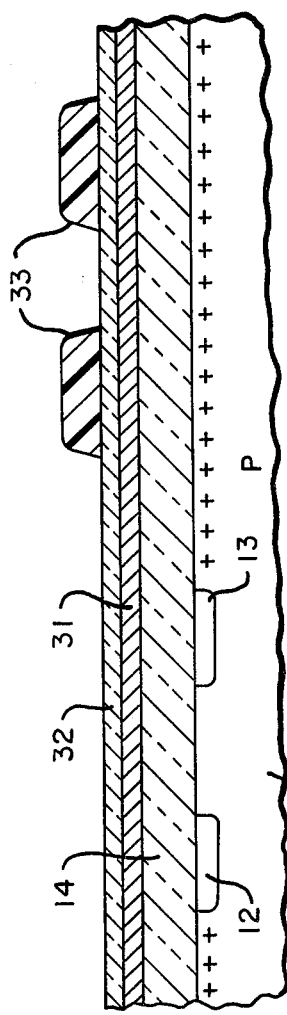
Figure 5:
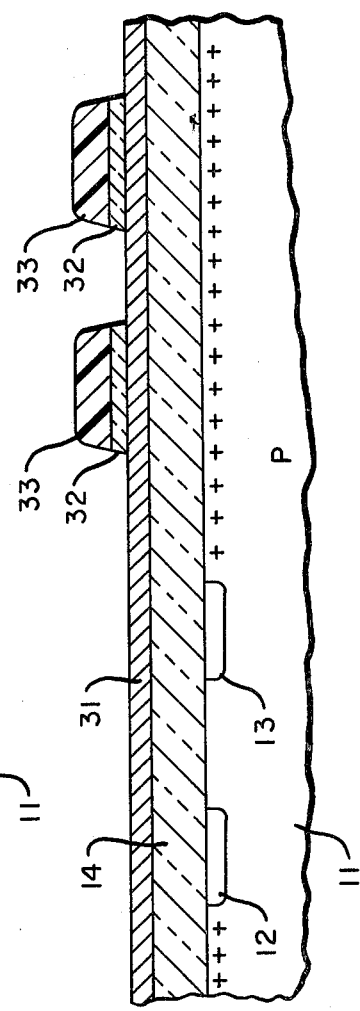
Figure 6:
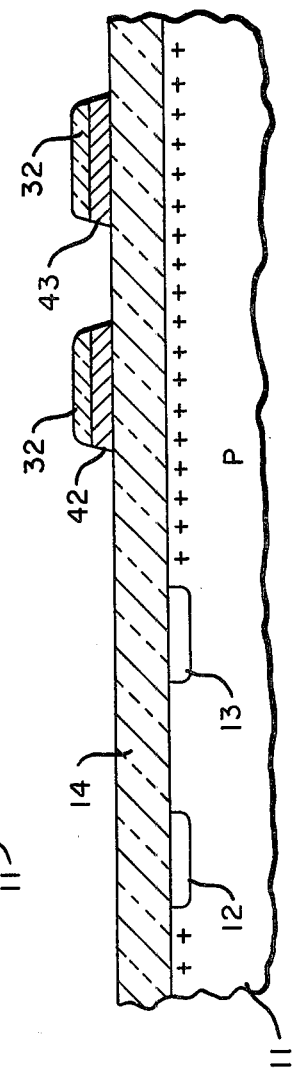
Figure 7:
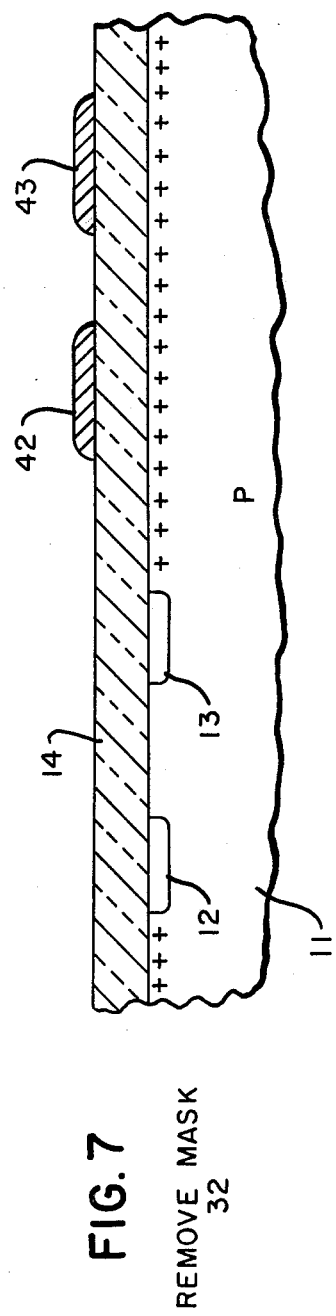

The polysilicon layer 31 is then deposited to a thickness of 5,000 Angstroms using pyrolysis of silane, at 700° C. and 1 atmosphere pressure. See FIG. 4. The polysilicon resistor is patterned using the oxide etch mask 32 (FIGS. 4–6). The polysilicon resistor 42 is formed to a length, l, (between contacts 66 and 67) of 10 microns and a cross-sectional area A (between the contacts) of 100 square microns to provide 100 megohms resistance. The contact regions 66 and 67 of the resistor are 3 microns $\times$ 3 microns and provide less than one megohm resistance after the threshold-adjusting boron implant.

After removing oxide mask 32 (FIG. 1), etching and deposition mask 51 is formed (FIG. 8) to expose the regions of the oxide that are to be etched to form the initial source, drain and gate cuts, and to define the resistor contact areas 66 and 67. (The resistor body is not implanted.) Then, the initial source and drain cuts and the gate cut are made in the field oxide 14 using buffered hydrofluoric acid etchant. The gate cut defines the channel region 25 of the FET 20. Boron implantation is done in the presence of mask 51 using an implant energy of 30 keV and a dose of $5 \times 10^{12}/cm^2$ to simultaneously adjust the threshold of the channel 25 of the FET to 1.2 volts and adjust the resistivity of the polysilicon contact 66 and 67 regions to $2 \times 10^9$ ohms per square. See FIG. 9. The mask 51 is then removed.

The non-memory gate oxide 16 is then grown about 450 Angstroms thick spanning the length of the channel, as shown in FIG. 10.

Silicon nitride is deposited 350 Angstroms thick ($3.5 \times 10^{-2}$ micron) over the circuit 10. See FIG. 11. The final source and drain contact cuts 74 and 75 and the polysilicon contact cuts 76 and 77 are etched in the silicon nitride layer 18 using hot phosphoric acid and in the silicon dioxide layer using a 10:1 mixture by volume of deionized water and hydrofluoric acid.

Ammonium metallization is formed 14,000 Angstroms thick (1.4 microns) by vacuum evaporation and is etched to shape 17 in a 60:10:1:7 mixture by volume of phosphoric acid, acetic acid, nitric acid and deionized water (FIG. 12). Finally, a silicon dioxide passivation layer (not shown) 12,000 Angstroms thick (1.2 microns) is formed over the circuit by chemical vapor deposition.

The simultaneous mpm-memory gate-polysilicon implant adjusts the FET 20 threshold to 1.2 volts, provides the desired low contact resistance (<1 Megohm), and prevents the formation of pn junctions between the polysilicon and the later-formed aluminum metalization.

The above example uses a gate (channel) doping level, $5 \times 10^{12}/cm^2$, that would require relatively large conductors. However, the doping levels can be increased to reduce the conductor size.

Thus, there has been described a method for simultaneously adjusting the threshold of non-memory field-effect transistors and the resistance of polysilicon components such as resistors, conductors, and contact regions by doping the FET channel and polysilicon regions to provide the desired threshold voltage after having tailored the geometry of the polysilicon components to the threshold-determining implant concentration. The process is applicable to CIS technology in general, and to single layer gate dielectric and multiple layer gate dielectric structures.

U.S. Ser. No. 962,423, filed the same date as the present application, and assigned to NCR, teaches another process which uses a simultaneous channel and polysilicon implant. This application teaches forming a memory CISFET structure which can be pure memory, split gae, or trigate, or a circuit having memory CISFETs only or both memory and non-memory CISFETs. This application is incorporated by reference.

According to the application Ser. No. 962,423, the source and drain are formed and the field is implanted as shown in FIGS. 1 and 2. Then all FETs, memory and non-memory, are given a base of non-memory implant prior to forming the field oxide (FIG. 3) and the polysilicon components (FIGS. 4–7). Next, rather than using the combined etching and implant mask of FIGS. 8 and 9, an etch mask is applied and the gate cuts and source and drain contact cuts are made. The implant of FIG. 9 is postponed. Instead, after etching the gate and source and drain cuts, the non-memory gate oxide of FIG. 10 is formed. Then, a memory mask is applied, memory regions are etched, and the memory and polysilicon implant is performed. This implant adjusts the base impurity concentration of memory devices or memory channel sections to the desired threshold voltge and simultaneously dopes the polysilicon components to the desired concentration. The non-memory devices or non-memory channel sections are protected by the mask and are left at the base, or non-memory, threshold voltage. Next, the device is coated with nitride and contact cuts are formed (FIG. 11), then metalization is applied (FIG. 12). Typically a passivation layer (not shown) is also added.

It should be noted that FIG. 12 refers to metalization and the exemplary process refers to the use of aluminum for the gate electrode and other conductors. The term metalization in FIG. 12 and elsewhere includes conductors generally, and thus refers to conductors such as polysilicon, as well as to conventional metal conductors such as aluminum, and to alloys such as aluminum-silicon.

Having described the invention and a preferred example of a process which incorporates the invention, what is claimed is:

1. In a process for forming an integrated circuit including at least one non-memory field effect transistor and at least one polysilicon component on a semiconductor substrate and wherein the threshold voltage of the field effect transistor and the resistance of the polysilicon component are determined by the impurity concentration therein, the improvement wherein, prior to forming the transistor gate electrode and circuit interconnections, the threshold voltage-determining concentration and the resistance-determining impurity concentration of at least a portion of the polysilicon component are established simultaneously in the partially completed integrated circuit which comprises the substrate having a source and drain formed therein and field insulation formed selectively thereon, by:
forming a layer of polysilicon on the field insulation in a predetermined pattern of at least one component, the size of the component being selected to provide a given resistance for a given impurity concentration therein;
forming a window in the insulating oxide over the location of the transistor channel;
selectively implanting the channel and the polysilicon component to establish the given threshold voltage-determining impurity concentration in the channel and the given resistance-determining impurity concentration in at least the portion of the polysilicon component; and
forming a non-memory gate insulator over the transistor channel.

2. In a process for forming an integrated circuit including at least one non-memory CIS field effect transistor and a polysilicon component on a semiconductor substrate, and wherein the threshold voltage of the transistor channel and the resistance of the polysilicon component are established by the impurity concentration therein, the improvement wherein the threshold voltage-determining impurity concentration and the polysilicon resistance-determining impurity concentration are established simultaneously in the partially processed integrated circuit comprising the substrate having a channel-defining source and drain formed therein and insulating oxide formed selectively thereon, and prior to forming the transistor gate electrode, by:
forming a layer of polysilicon on the partially processed integrated circuit in a predetermined pattern of at least one passive component, the geometry of the component being selected to provide the predetermined conductivity for a given impurity concentration therein;
forming on the partially processed integrated circuit a mask having windows defining the channel and deposition sites on the polysilicon;
etching the insulating oxide via the mask to expose the channel;
implanting impurities in the exposed channel and in the mask-defined polysilicon deposition sites sufficient to establish the given threshold voltage-determining and conductivity-determining impurity concentration in the channel and in the polysilicon component; and
forming a non-memory oxide layer over the channel.

3. The improved process of claim 2, further comprising after the step of forming the non-memory gate oxide layer, forming a layer of silicon nitride over at least the channel.

4. In a process for forming an integrated circuit comprising a CIS non-memory field effect transistor and a polysilicon component on a semiconductor substrate, the improvement wherein a given threshold voltage-determining and polysilicon resistance-determining impurity concentration are established simultaneously in the channel and the polysilicon component, the improvement comprising:
forming a source and drain in the semiconductor substrate;
selectively doping areas of the substrate to control parasitic conduction;
forming a layer of field oxide on the substrate;
forming a polysilicon layer in a predetermined pattern comprising at least one passive component, the geometry and thickness thereof being selected to provide the given resistance for a given impurity concentration;

forming a mask over the field oxide and polysilicon having windows defining the channel region of the transistor and deposition sites in the polysilicon;

etching the field oxide in the presence of the mask to expose the transistor channel region;

selectively ion implanting the integrated circuit in the presence of the mask to establish the given impurity concentration in the channel and in the polysilicon component;

forming a non-memory oxide layer over the channel; and selectively forming a transistor gate electrode and interconnections to the source, drain, and polysilicon component.

5. The process of claim 4, wherein the gate electrode is metal, metal alloy, or polysilicon.

6. The process of claim 5, wherein after forming the channel oxide, a silicon nitride layer is formed over the circuit.

* * * * *